US008890219B2

(12) United States Patent
Grenouillet et al.

(10) Patent No.: US 8,890,219 B2
(45) Date of Patent: Nov. 18, 2014

(54) UTBB CMOS IMAGER HAVING A DIODE JUNCTION IN A PHOTOSENSITIVE AREA THEREOF

(71) Applicant: Commissariat a l'energie atomique et aux energies alternatives, Paris (FR)

(72) Inventors: Laurent Grenouillet, Rives (FR); Maud Vinet, Rives (FR)

(73) Assignee: Commissariat a l'energie atomique et aux energies alternatives, Paris (FR)

(*) Notice: Subject to any disclaimer, the term of this patent is extended or adjusted under 35 U.S.C. 154(b) by 18 days.

(21) Appl. No.: 13/661,418

(22) Filed: Oct. 26, 2012

(65) Prior Publication Data

US 2013/0113066 A1    May 9, 2013

(30) Foreign Application Priority Data

Oct. 28, 2011  (FR) ...................................... 11 59802

(51) Int. Cl.
*H01L 31/109*    (2006.01)
*H01L 27/146*    (2006.01)
*H01L 31/18*    (2006.01)

(52) U.S. Cl.
CPC ........ *H01L 27/146* (2013.01); *H01L 27/14612* (2013.01); *H01L 27/14636* (2013.01); *H01L 27/1464* (2013.01); *H01L 27/1461* (2013.01); *H01L 31/18* (2013.01); *H01L 27/14632* (2013.01); *H01L 27/14694* (2013.01)
USPC ........... 257/292; 257/462; 257/461; 257/464; 257/465

(58) Field of Classification Search
CPC .................. H01L 27/14616; H01L 27/14614; H01L 27/146; H01L 27/1464; H01L 27/14694; H01L 27/1461; H01L 27/14636; H01L 27/14612; H01L 27/14632; H01L 31/18

USPC ............ 257/462, E27.13, 292, 461, 464, 465
See application file for complete search history.

(56) References Cited

U.S. PATENT DOCUMENTS

| 4,954,895 A | 9/1990 | Akimoto et al. |
| 6,967,120 B2 | 11/2005 | Jang et al. |

(Continued)

FOREIGN PATENT DOCUMENTS

| WO | WO 2006/043105 A1 | 4/2006 |
| WO | WO 2007/001146 A1 | 1/2007 |

OTHER PUBLICATIONS

Green, "Self-consistent optical parameters of intrinsic silicon at 300 K including temperature coefficients", Solar Energy Materials & Solar Cells 92 (2008) 1305-1310.*

(Continued)

*Primary Examiner* — Fernando L Toledo
*Assistant Examiner* — Peter Bradford
(74) *Attorney, Agent, or Firm* — Oblon, Spivak, McClelland, Maier & Neustadt, L.L.P.

(57) ABSTRACT

An image sensor device is provided, including at least one transistor lying on a semiconductor-on-insulator substrate that includes a semi-conducting layer, in which a channel area of the transistor is disposed in a portion thereof, and an insulating layer separating the semi-conducting layer from a semi-conducting support layer, wherein the semi-conducting layer and the insulating layer extend beyond the channel area, and extend under at least a portion of source/drain regions of the transistor, wherein the semi-conducting support layer includes at least one photosensitive area including at least one P-doped region and at least one N-doped region forming a junction, the photosensitive area being disposed facing the transistor on a side of the channel area thereof and opposite a side of a gate electrode thereof, and wherein the insulating layer is configured to provide a capacitive coupling between the photosensitive area and the semi-conducting layer.

8 Claims, 9 Drawing Sheets

(56) References Cited

U.S. PATENT DOCUMENTS

Figure 1:
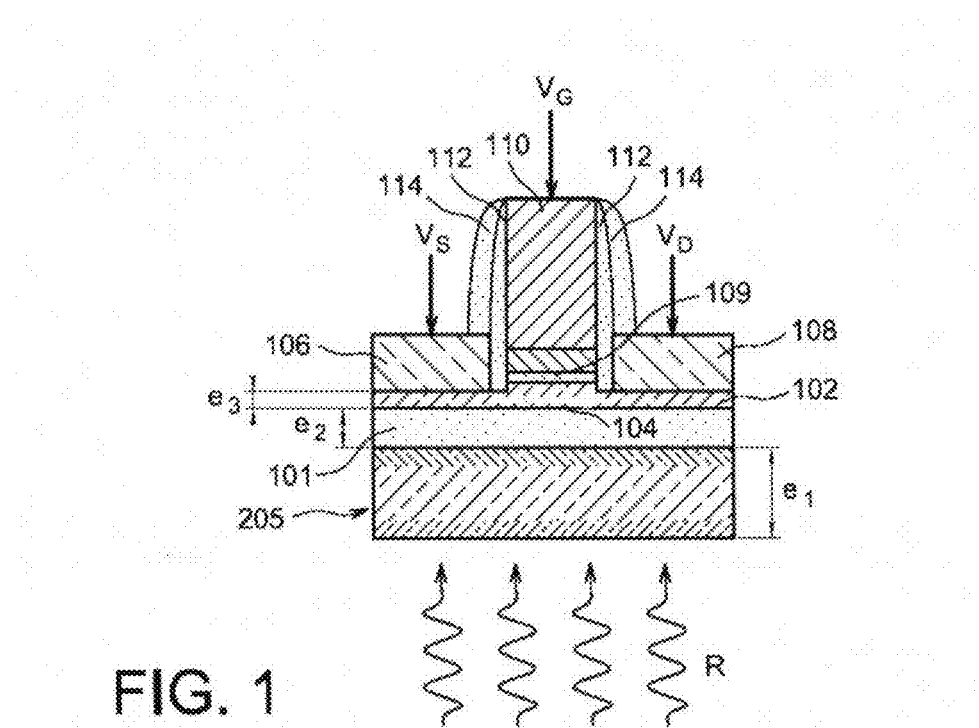

| | | | |
|---|---|---|---|
| 2006/0125038 A1* | 6/2006 | Mabuchi | 257/447 |
| 2007/0012970 A1* | 1/2007 | Mouli | 257/292 |
| 2007/0215921 A1* | 9/2007 | Hsu et al. | 257/290 |
| 2009/0284731 A1* | 11/2009 | Jin et al. | 356/4.01 |
| 2010/0013907 A1 | 1/2010 | Lee | |
| 2010/0127342 A1 | 5/2010 | Mabuchi | |
| 2011/0084317 A1 | 4/2011 | Mabuchi | |
| 2011/0084351 A1 | 4/2011 | Mabuchi | |
| 2011/0084352 A1 | 4/2011 | Mabuchi | |
| 2011/0086463 A1 | 4/2011 | Mabuchi | |
| 2013/0049117 A1* | 2/2013 | Zhu et al. | 257/347 |

OTHER PUBLICATIONS

French Preliminary Search Report issued Sep. 19, 2012 in Patent Application No. 1159802 with English Translation of Category of Cited Documents.

* cited by examiner

UTBB CMOS IMAGER HAVING A DIODE JUNCTION IN A PHOTOSENSITIVE AREA THEREOF

TECHNICAL FIELD AND PRIOR ART

The present invention relates to the field of photodetection and imaging and is concerned with the implementation of a imager device being improved in terms of arrangement and provided with a photodetection element and a reading element which are associated, wherein the signal transmission between the detection element and the reading element is simplified.

An image sensor device can be formed with a matrix of photodetector elements which is connected and assembled with a reading electronic circuit by connecting elements. According to a known exemplary embodiment, these connecting elements can be indium beads. Such an assembling requires an accurate aligning between the reading circuit and photodetector elements and gives rise to bulkiness problems.

In a CMOS type image sensor device, pixels are generally formed with a photodetector element such as a photodiode for example of the type commonly called "pinned", and with a reading element, for example in the form of a charge/voltage converter.

An exemplary CMOS image sensor is given in document U.S. Pat. No. 6,967,120 B2 and includes a reading transistor the gate of which is adjoined to the photodiode, the transistor being made on a same face of a substrate as the photodiode.

In this type of device, the reading transistor is used for collecting excess electrons generated by the detected light. During this transfer, part of the electrons can be recombined, which decreases the collection efficiency.

In such a sensor, the reading transistor also occupies on the substrate a space which is not directly used for converting light into electrons.

Document WO 2006/043105 A1 has an image sensor device comprising a reading transistor lying on a semiconductor-on-isolator substrate, the substrate including a semiconducting support layer wherein a junction is made and which is intended to produce charges when the support layer is illuminated. Charges generated at this junction are collected through a metal interconnection provided between the reading transistor and the junction.

Document U.S. Pat. No. 4,954,895 discloses in turn an image sensor device provided with a first transistor the channel of which is located in a P-doped semi-conducting layer lying on a N-doped semi-conducting layer with which it makes a junction. When this junction is illuminated, charges are produced, collected at the drain of the first transistor and transmitted to a switching transistor the drain area of which contacts that of the first transistor.

There arises the problem of implementing a new image sensor structure improved in relation with the drawbacks discussed above, in particular in terms of bulk.

DISCLOSURE OF THE INVENTION

The present invention first provides an image sensor device comprising at least one transistor lying on a substrate comprising a thin semi-conducting layer wherein a channel area of said transistor is provided, an insulating layer separating the thin semi-conducting layer with a semi-conducting support layer, the semi-conducting support layer comprising at least one photodetection area including at least one P-doped region and at least one N-doped region forming a junction, the junction being provided facing the channel area of said transistor.

The material from which the insulating layer is formed, as well as the thickness of this insulating layer, are set such that a capacitive coupling can be established between the photodetection area and the channel area of said transistor.

Thus, a light radiation incident on the photodetection area generates a detection signal transmitted through capacitive coupling to said transistor.

Such a device has an improved arrangement and in particular a restricted bulk relative to devices wherein a reading transistor and a photodetection area are juxtaposed.

With respect to a device according to prior art wherein a reading transistor and a photodetection area are juxtaposed, the device according to the invention enables, for a substrate of the same size, a higher area to be dedicated to photodetection.

With a device according to the invention, the entire surface of the photosensitive area on which lies the transistor can be used to carry out a light radiation detection, unlike a CMOS sensor according to prior art for which part of a single detection element is generally occupied by at least one reading transistor.

In the device according to the invention, dedicated connectics between the photosensitive area and a reading transistor are not required, which can facilitate in particular making the device and in particular allows to get rid of problems of surface condition, debonding and mechanical stress.

Thus, the device can be provided such that the transistor and the photosensitive area are coupled but are not connected through an electrical connection. In this case, the portion of the insulating layer separating the transistor and the sensitive area is continuous, without a connecting element passing therethrough.

According to the invention, a light radiation incident on the photodetection area induces a change in the threshold voltage of said transistor.

To do this, the insulating layer can be provided with a thickness which may be equal to or less than 25 nanometers or equal to or less than 10 nanometers.

The thin semi-conducting layer can in turn have a thickness of less than 800 nm and advantageously between 5 nm and 100 nm.

The photodetection area can have a thickness of less than 1 micrometer.

According to a possible embodiment, the junction is a P-I-N junction.

A PIN junction allows to obtain a charge area having a higher thickness space and thus to increase the thickness of the effective collection area of photons. When photons are absorbed in the thickness corresponding to this space charge area, the electron-hole pairs photogenerated are efficiently dissociated, which maximizes the voltage induced across the photodiode.

The photosensitive area and the thin semi-conducting layer can be based on different semi-conductor materials. The material making up the photodetection layer can thus be selected as a function of the wavelengths to be detected, whereas the material wherein the channel area of the transistor is made is selected so as to enable the latter to be provided with optimum electric performances.

According to another aspect, the present invention also relates to a method for making an image sensor device comprising the steps of:

making a transistor lying on a substrate, the substrate comprising an insulating layer and a thin semi-conducting layer wherein a channel area of said transistor is made, assembling a semi-conducting support layer for forming a photosensitive area comprising a junction facing the channel area of said transistor.

Such an assembling can be made without requiring an accurate aligning.

Such an assembling allows to implement an image sensor device comprising a previously doped support layer and possibly to implement a support layer based on a different material from that of the thin semi-conducting layer wherein the channel of the transistor is made.

Such an assembling also allows to implement an image sensor device comprising a support layer having a reduced thickness.

The material from which the insulating layer is formed, as well as the thickness of this insulating layer are set such that a capacitive coupling can be established between the photodetection area and the channel area of said transistor.

The assembling can be performed by molecular bonding of the insulating layer with another insulating layer covering said support layer.

Such an assembling enables to implement a photodetection area based on semi-conductor materials such as InGaAs, or InSb, or GaN, or CdHgTe, and which unlike a semi-conductor material such as Si are difficult to arrange as wafers having great sizes.

BRIEF DESCRIPTION OF THE INVENTION

Figure 2:
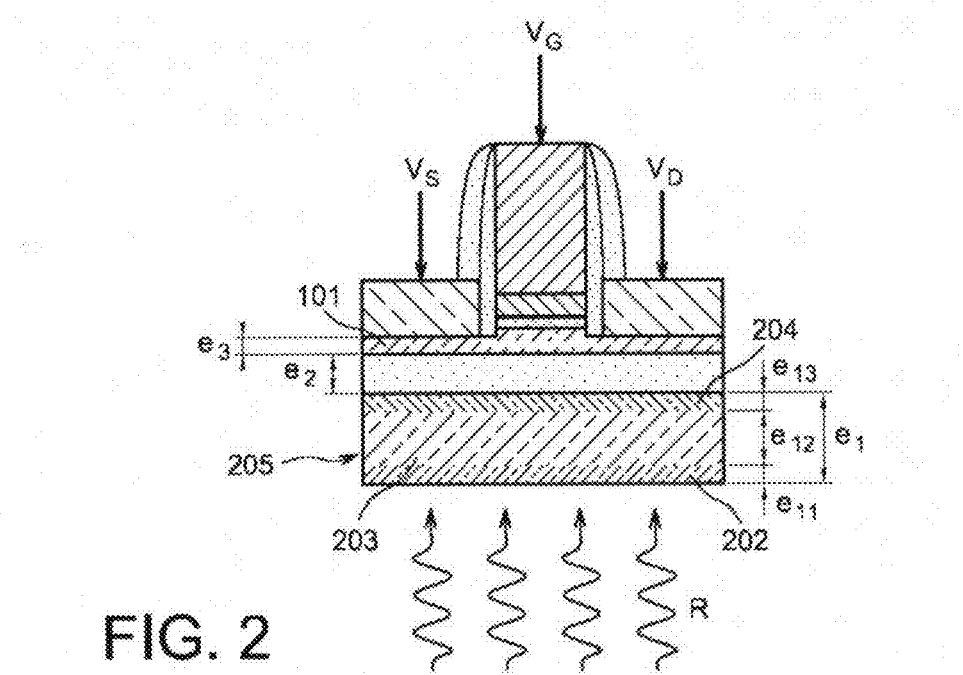
Figure 3A:
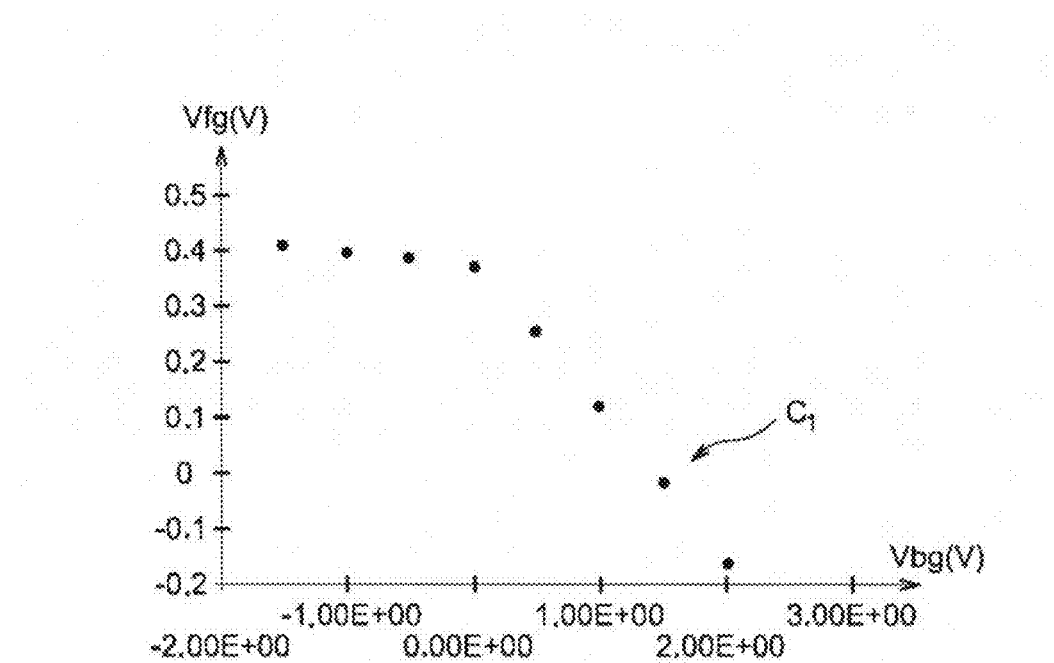
Figure 3B:
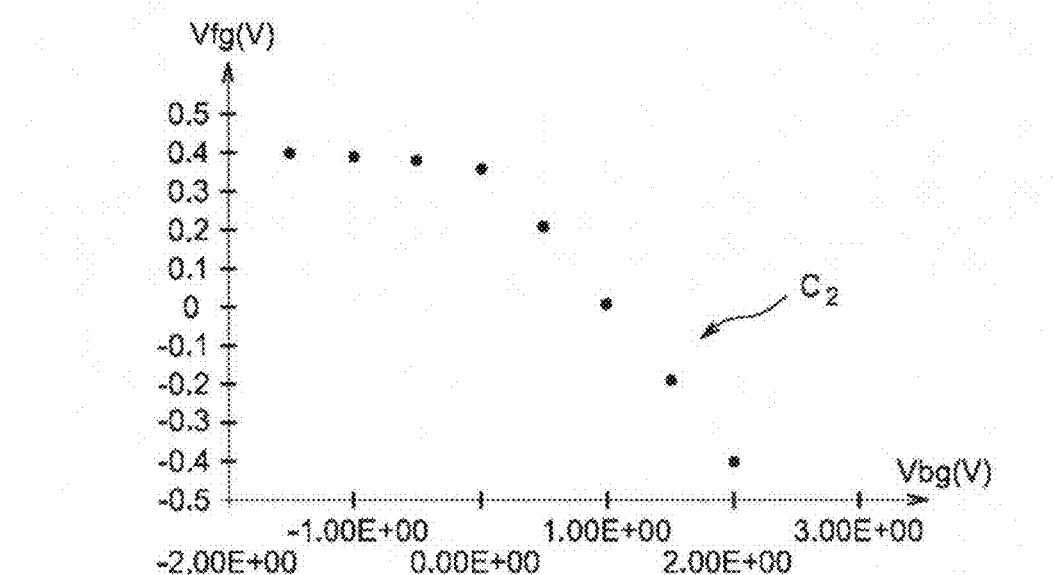
Figure 4:
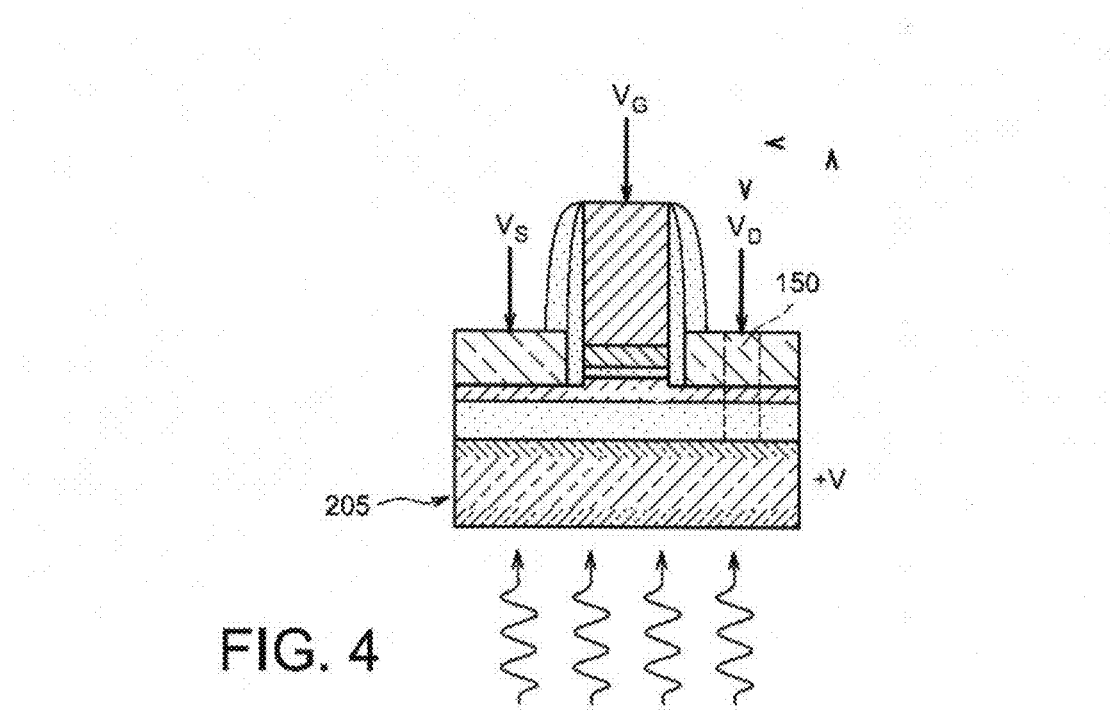
Figure 5A:
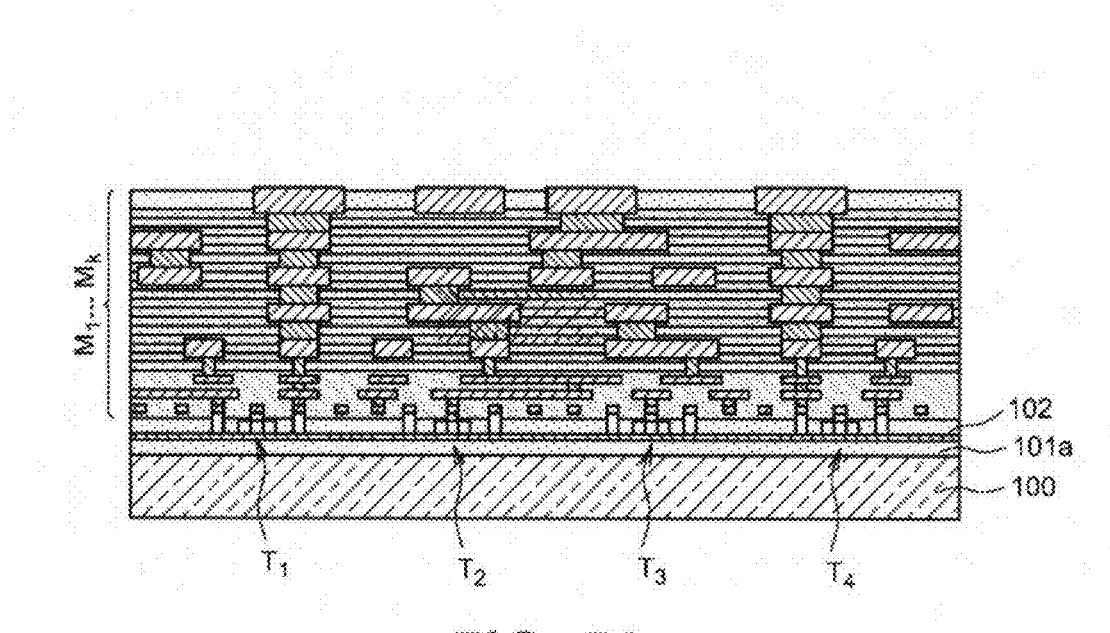
Figure 5B:
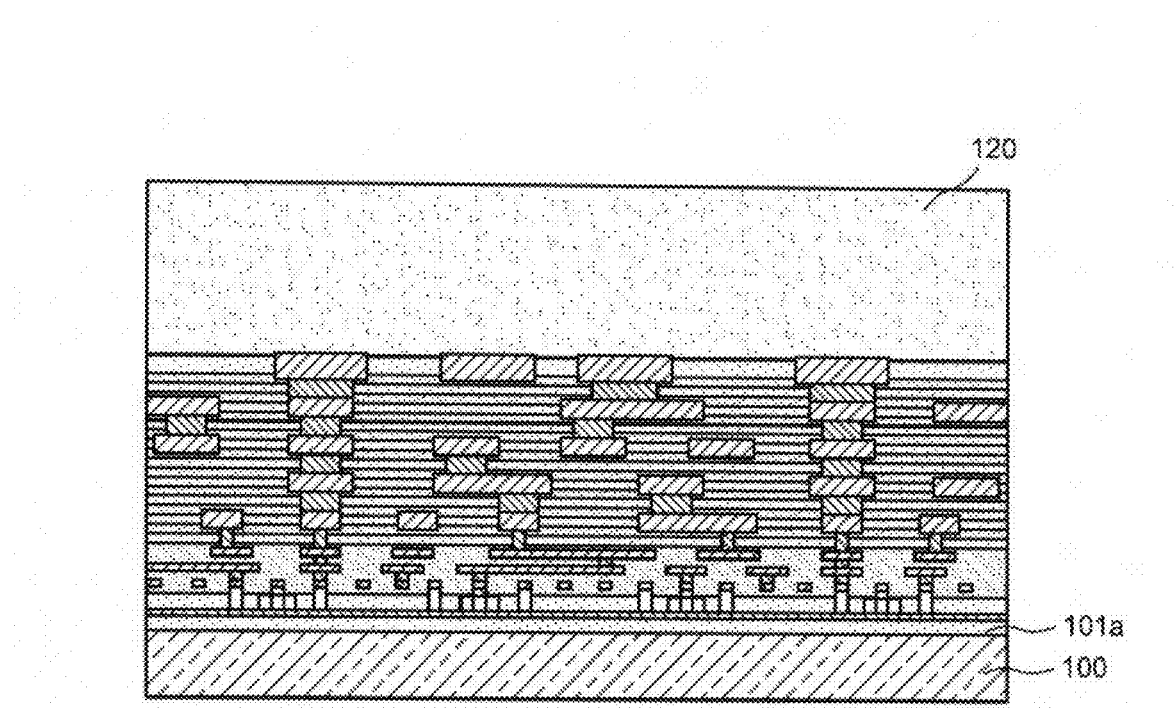
Figure 5C:
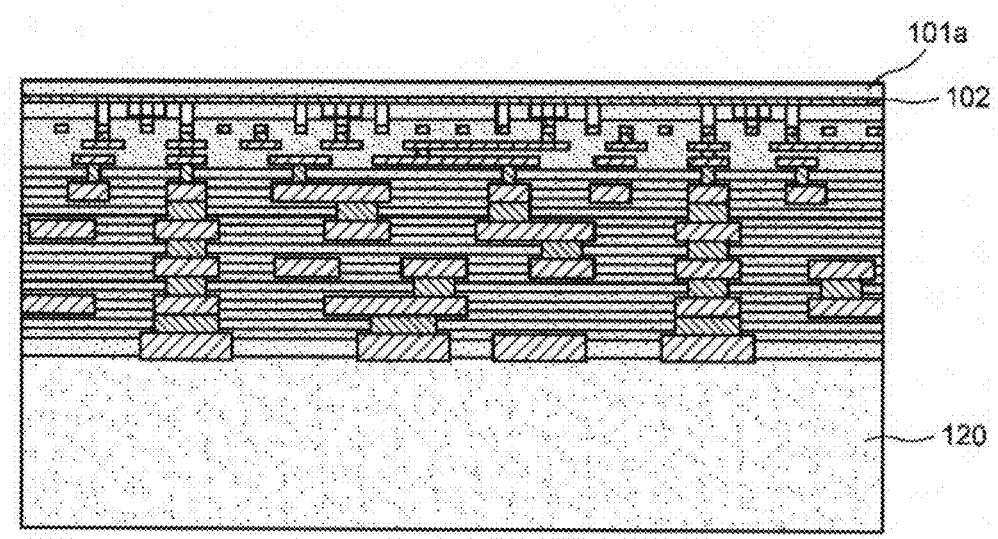
Figure 5D:
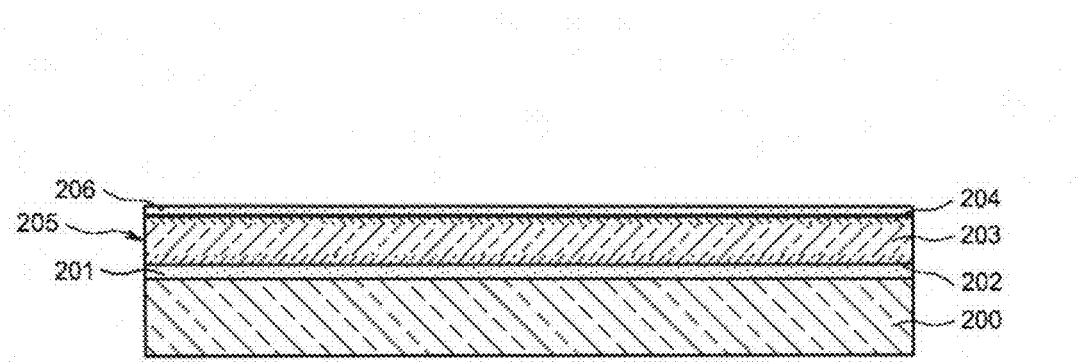
Figure 5E:
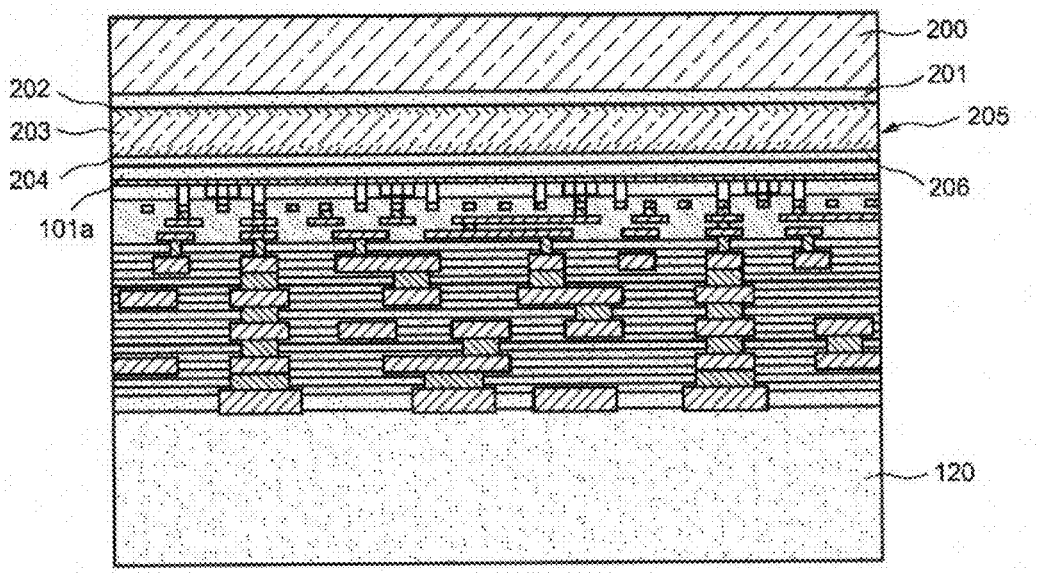
Figure 5F:
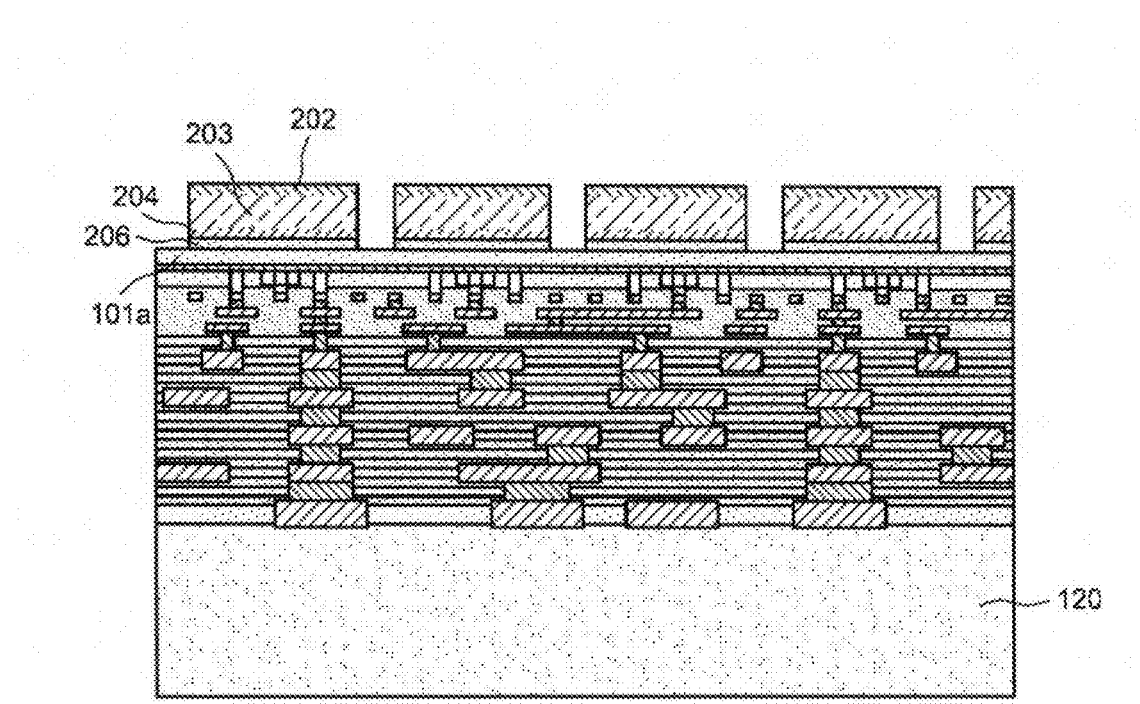
Figure 5G:
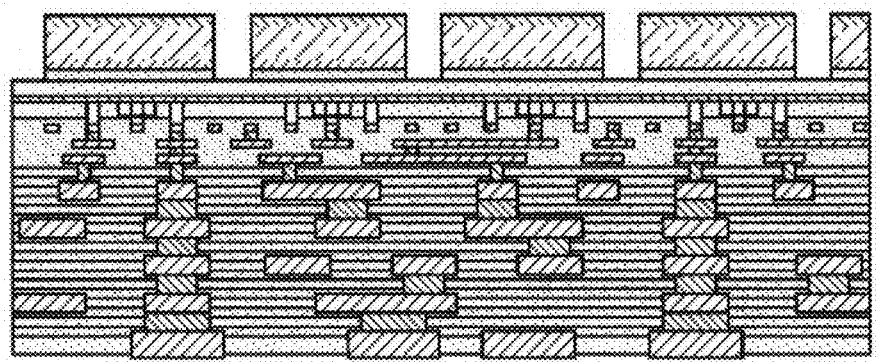
Figure 5H:
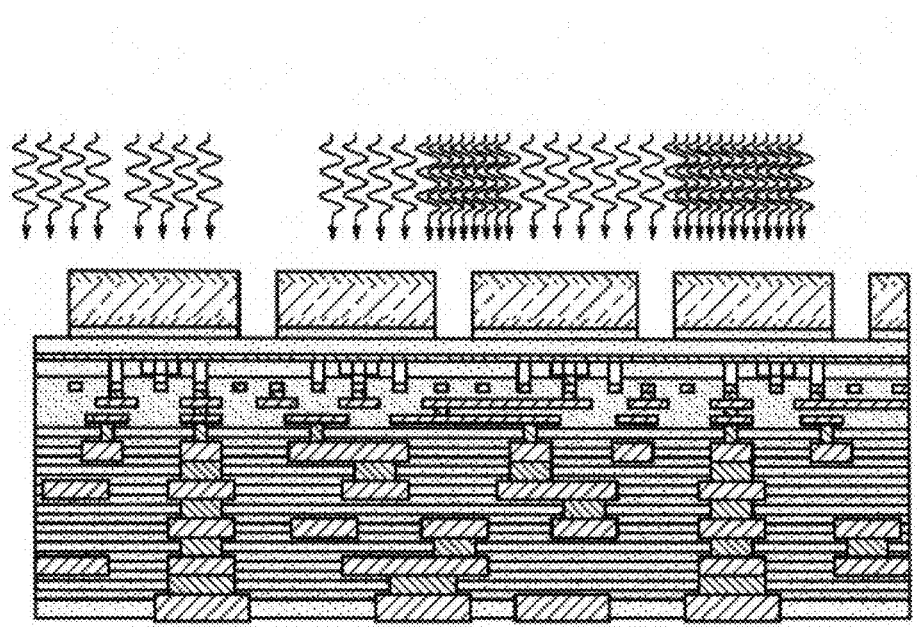
Figure 6:
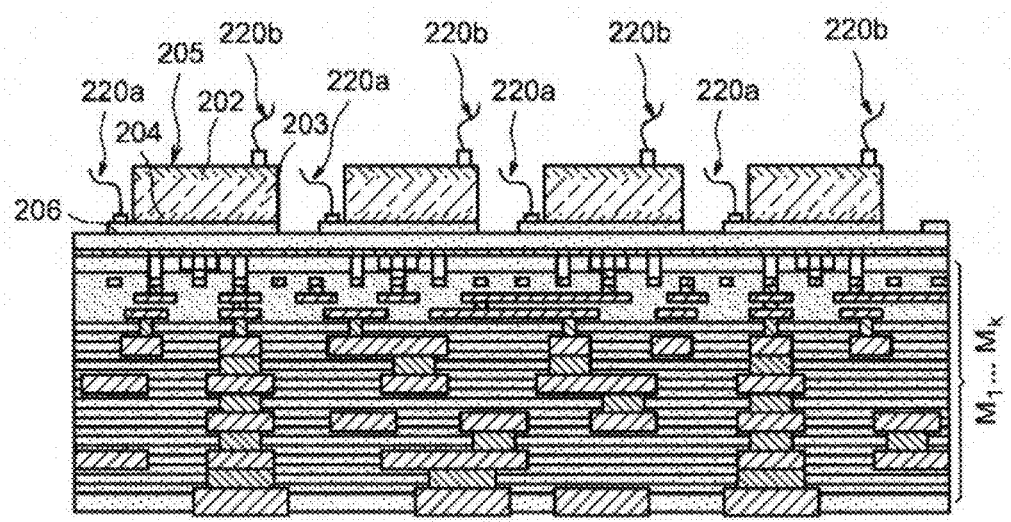
Figure 7:
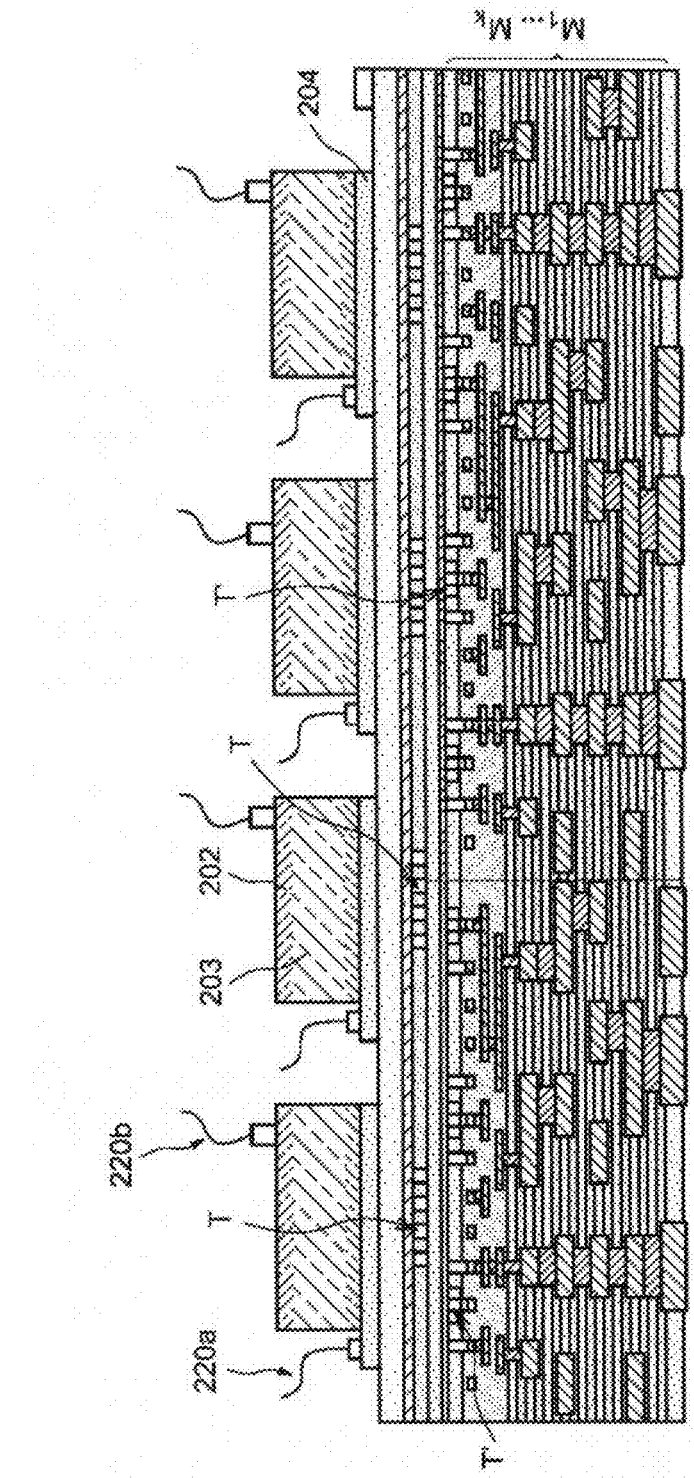
Figure 8:
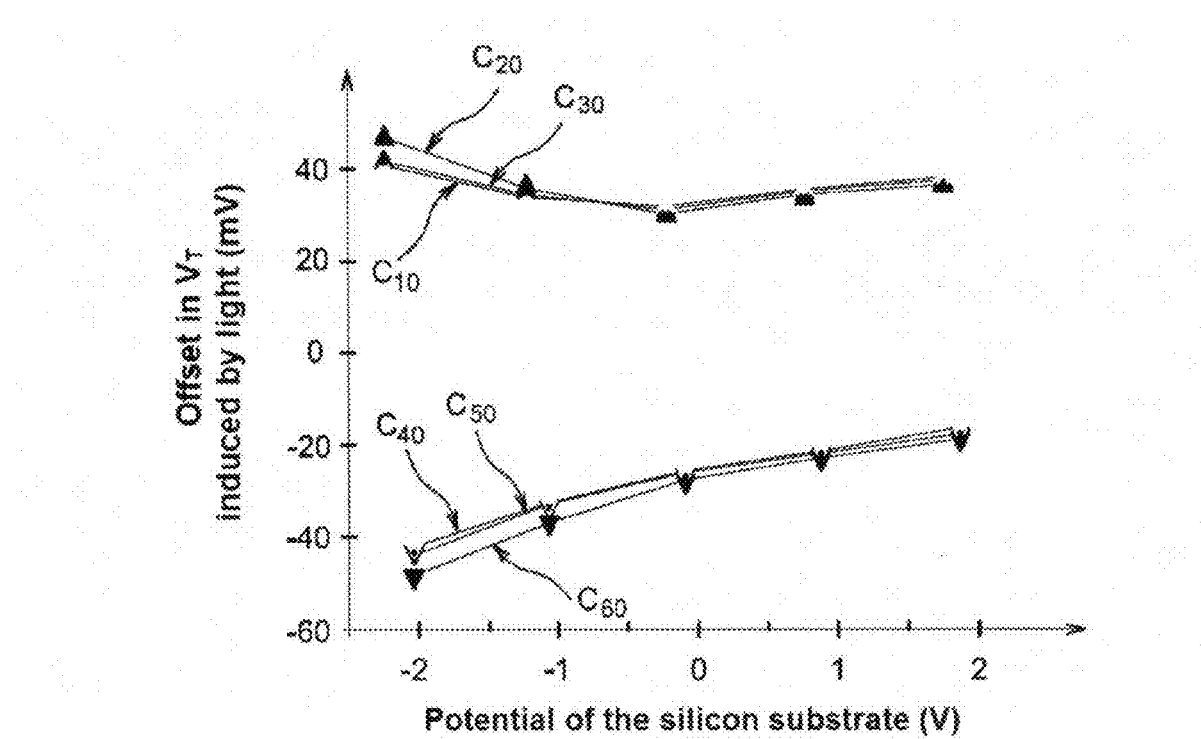

The invention will be better understood upon reading the description of exemplary embodiments given by way of purely indicative and in no way limiting purposes, making reference to the appended drawings wherein:

FIG. 1 illustrates an exemplary image sensor device according to the invention provided with a photosensitive area including a junction provided facing the channel of a detection transistor lying on an insulating layer, FIG. 2 illustrates an exemplary image sensor device according to the invention provided with a photosensitive area comprising a PIN junction, FIGS. 3A-3B illustrate a coupling phenomenon in an image sensor device according to the invention, between a photosensitive area and a semi-conducting area of a channel of a detection transistor, FIG. 4 illustrates an exemplary image sensor device according to the invention provided with a detection transistor one electrode of which is put to the potential of a photosensitive area provided facing said transistor, FIGS. 5A-5H illustrate an exemplary method for making an image sensor device according to the invention including at least one photosensitive area provided facing the channel of at least one detection transistor lying on an insulating layer, FIG. 6 illustrates an exemplary image sensor device according to the invention provided with contact areas which can be based on ITO, FIG. 7 illustrates an exemplary image sensor device according to the invention provided with transistors of a reading circuit which are placed in a stack between detection transistors of the same type as given in FIGS. 1 to 3, and metal interconnection levels, FIG. 8 illustrates a variation in threshold voltage on N-type and P-type transistors having an arrangement of the same type as FIG. 2 and subjected to a variable lighting.

Identical, similar or equivalent parts of the different figures have the same reference numerals so as to facilitate switching from one figure to another.

The different parts represented in the figures are not necessarily drawn to a uniform scale, for the figures to be more readable.

DETAILED DESCRIPTION OF PARTICULAR EMBODIMENTS

An exemplary single cell also called "pixel" of an image sensor device according to the invention will now be described in connection with FIGS. 1, 2 and 3.

This pixel comprises a photosensitive area 205 formed with at least two superimposed doped areas making a diode junction, for example a PN-type junction.

The thickness $e_1$ of the photosensitive area and exposed to the radiation, can be set higher than 1/a, a being the linear absorption coefficient of the material of the photosensitive area, in order to maximize the absorptions of photons in the photosensitive part, and in particular in the space charge area.

The thickness $e_1$ of the photosensitive area can for example be between 100 nm and 10 µm, for example in the order of 1 µm.

The photodetecting area can have an area for example in the order of one $\mu m^2$ for a wavelength detection for example in the order of one micrometer.

In the example given in FIG. 2, the photosensitive area 205 is in the form of a PIN diode and comprises a first area 202 doped according to a first type doping, for example the N-type one, which can be stripped or uncovered.

The first doped area 202 has a thickness $e_{11}$ which can be set higher than 1/a and for example between 2 nm and 200 nm or in the order of 100 nanometers.

The first doped area 202 is underlying an intrinsic or undoped semi-conducting area 203, having a thickness $e_{12}$ which can be for example between 100 nm and one or more microns, in turn underlying a second doped area 204 according to a second type doping, for example of the P-type. The second doped area 204 has in turn a thickness $e_{13}$ which can be for example between 100 nm and 1 µm.

The photosensitive area 205 is based on a material selected as a function of the wavelength or the wavelength range desired to be detected. The photosensitive area 205 can be formed for example by one or more semi-conductor material(s) from the following materials: Si, Ge, InGaAs, InSb, CdHgTe, GaN.

In one case, for example, where the sensor is provided to detect radiation located in the UV field, the material of the photosensitive area 205 can be a III-V semi-conductor material, for example based on GaN or AlGaN.

In another case, for example, where the sensor is for detecting a radiation having a wavelength in a range of less than 1.1 µm, the photosensitive area can for example be based on silicon.

If one desires to detect a radiation having a wavelength in a range between 1.3 µm and 1.55 µm, the material of the photosensitive area can for example be set based on Germanium or a III-V material such as InGaAs.

According to another example, to detect a radiation having a wavelength in a range between 3 µm and 5 µm or between 8 µm and 12 µm, a II-VI material, for example based on CdHgTe can be used.

The photosensitive area 205 thus forms a support layer for a semiconductor-on-insulator type substrate and is underlying a thin insulating layer 101. This thin insulating layer 101 can be for example based on $SiO_2$. The thin insulating layer 101 can be set with a thickness $e_2$ selected low enough for a voltage photogenerated on its back face to be able to induce a corresponding voltage by the capacitive coupling phenomenon on its front face.

The maximum thickness $e_{2max}$ of the thin insulating layer 101 can in particular be set so as to allow a capacitive coupling between the photosensitive area 205 and a thin semi-conducting layer 102 contacting the latter. The thickness $e_2$ of the thin insulating layer is preferably lower than 300 nm and between for example 2 nm and 300 nm, for example equal to or lower than 25 nanometers or equal to or lower than 10 nanometers.

By way of example, a variation in the threshold voltage of the transistor T can be in the order of 80 mV when a 1V potential is applied on the back face of the insulating layer 101 based on $SiO_2$ having a thickness $e_2$ in the order of 25 nm and a thin semi-conductor layer 102 of silicon of 7 nm.

The thin semi-conducting layer 103 overlying the insulating layer 101 can in turn be set with a thickness $e_3$ lower than 800 nm corresponding to the depletion thickness of an undoped substrate for a 0V gate voltage, and in particular between for example 5 nm and 100 nanometers. A thickness lower than 100 nm enables a completely depleted layer to be obtained.

The implementation of the semi-conducting layers 103 and 205 and an insulating layer 101 having low thicknesses can enable an image sensor to be made with a total thickness low enough to be flexible.

In the thin semi-conducting layer 102, a channel area 104 of a transistor T is formed. The thin layer 102 can be based on a different semi-conductor material from that of the photosensitive area.

The thin layer 102 can be, for example, based on silicon, whereas the photosensitive area 205 is formed from another semi-conductor material selected as a function of the light radiation to be detected. The channel of the transistor T can be completely depleted. The transistor T thus made can be of the UTBB ("Ultra Thin BOX and Body") type.

This transistor further includes a gate dielectric area 109, as well as a gate electrode 110 lying on the dielectric area 109.

The channel area 104 and the gate 110 of the transistor T are located facing a region of the photosensitive area 205. In the case, for example, where the gate 110 has a critical dimension or a length for example in the order of 30 nm, the thin semi-conducting layer 102 can be set for example between 5 nanometers and 7 nanometers.

The gate 110 is surrounded on either side with insulating areas forming first spacers 112. The first spacers 112 are partly buried in the active area of the transistor T and in contact with flanks of the gate 110, whereas other insulating areas forming second spacers 114 lie on the active area of the transistor T and are provided against the first spacers 112.

When the photosensitive or photodetecting area 205 is subjected to light radiation R, this can cause a change in the threshold voltage $V_T$ of the transistor T and the amplitude of this change can enable to translate a detection of a given photon flow associated with this light radiation. A detection of some light radiations penetrating the front face of the device, that is the face where the gate 110 is located, is possible.

A reading circuit can for example be implemented at the transistor(s) used for detection. The transistors of the reading circuit are preferably set such that their threshold voltage, unlike the transistor T, be insensitive to the luminous flow. To do this, these transistors of the reading circuit can for example be implemented such that they have an insulating layer 101 being thicker or a higher channel thickness or a doping such that it is not completely depleted.

According to a possible implementation, a binary detection mode can be made with a sensor according to the invention. Thus, the image sensor device can be set such that, when there is no light radiation to be detected, the threshold voltage $V_T$ of the transistor T is equal to a value Vt1.

When the sensor receives a light radiation R, a change in the transistor bias at its ground plane induces a change in the threshold voltage of the transistor being equal to another value Vt2=Vt1+ΔVt or Vt2=Vt1−ΔVt, with ΔVt not null.

The transistor can thus be in an OFF state when there is no photon flow to be detected and in an ON state when there is a photon flow to be detected.

When the image sensor device is operating, the bias voltages VD and VG respectively set on the drain area and on the gate of the transistor T can be in the order of one volt.

FIG. 3A illustrates, for an exemplary device implemented according to the invention and through a curve $C_1$, the dependence of a voltage Vfg taken at the front face of the device at the thin semi-conducting layer 103 in relation with the potential Vbg at the back face of this device at the photosensitive area 205, when the thin semi-conducting layer 103 is based on silicon and has a thickness $e_3$ in the order of 10 nm, the insulating layer 101 is a BOX layer having a thickness $e_2$ in the order of 5 nm. With such a device, a sensitivity of 260 mV/V can be achieved.

In FIG. 3B, a curve $C_2$ illustrates the dependence of the voltage Vfg taken at the front face in relation with the potential Vbg taken at the back face, this time for a device provided with a thin semi-conducting layer 103 based on silicon and having a thickness $e_3$ in the order of 120 nm, and an insulating BOX layer 101 having a thickness $e_2$ in the order of 25 nm. With such a device, a sensitivity of 350 mV/V can be achieved.

FIG. 4 illustrates a particular detection principle wherein a given potential +V generated at the photosensitive area 205 by a light radiation coming from the face opposite to that where the gate 110 of the transistor T is located, is applied to one of the electrodes of the transistor T, for example the drain electrode 108 to change the electrical characteristics thereof.

For this embodiment, a connecting element 150 can be for example provided between the drain and the photosensitive area.

A method for making an image sensor device according to the invention will now be described in connection with FIGS. 5A-5H.

One or more transistors $T_1$, $T_2$, $T_3$, $T_4$ are first made on a semiconductor-on-insulator type substrate, for example of the SOI ("Silicon on Insulator") type comprising a sacrificial support layer 100, a thin insulating layer 101a lying on the support layer 100 and a thin semi-conducting layer 102 lying on the insulating layer 101a.

Transistors $T_1$, $T_2$, $T_3$, $T_4$ can be made according to a CMOS method and a UTBB type die, that is with the layers 101a and 102 having a very low thickness, in particular an insulating layer 101a equal to or lower than 25 nanometers and a thin semi-conducting layer 102 lower than 10 nanometers.

The thin insulating layer 101 can for example be a buried silicon oxide layer set with a thickness $e_2$ for example equal to or lower than 25 nanometers or equal to or lower than 10 nanometers. The thin semi-conducting layer 102 is in turn set with a thickness $e_3$ between for example 5 and 10 nanometers, for example in the order of 6 nanometers.

Some of the transistors $T_1$, $T_2$, $T_3$, $T_4$ can have respective threshold voltages $V_T$ which are different depending on whether they are adapted to photodetection. Several interconnection metal levels $M_1, \ldots, M_k$ can then be formed in a stack of insulating layers overlying the transistors $T_1, \ldots, T_4$ (FIG. 5A).

Then, a handle layer 120 is formed which for example can be of a polymeric material or another silicon plate bonded upside down with the CMOS plate. The handle layer 120 allows gripping the circuit being made. This handle layer 120 can possibly be formed by molecular bonding of a plate on the top of the circuit (FIG. 5B).

Then, a removal of the sacrificial support layer 100 is performed. This removal can be performed for example by a polishing method commonly called "grinding", wherein a rotating planar surface comprised of an abrasive material mechanically removes the material 100, and through chemical etching for example based on a TMAH ("tetra-methyl ammonium hydroxide") in particular when the sacrificial support layer 100 is based on Si. An etch stop is made on the thin insulating layer 102 (FIG. 5C).

The photosensitive area 205 can in turn be independently formed on another plate or another support on which a photodetector stack is made. A stack formed for example by a N-doped Ge layer 202 covered and in contact with an undoped Ge layer 203, this layer 203 being covered and in contact with a full plate P-doped Ge layer 204 on a GeOI type substrate, can be made. This other substrate comprises a support layer 200 covered by an insulating layer 201, for example based on $SiO_2$. After the P-doped Ge layer 204 is made, a thin insulating layer 206 can be formed, for example by deposition, which can be for example based on $SiO_2$ and is intended to be used as a bonding layer (FIG. 5D).

A bonding, for example a direct $SiO_2$—$SiO_2$ bonding of the layer 206 with the thin insulating layer 101a is then made in order to assemble the circuit comprising the transistors $T_1, \ldots, T_4$ with the photosensitive area 205 (FIG. 5E).

A removal of the support layer 200 of the photodetector stack with a stop on the insulating layer 201 can thus be performed. A stop on the insulating layer 201 enables all the active layers to be preserved. This insulating layer 201 can then be removed in order to strip the doped area 202.

Then, an etching of the photosensitive area can be performed in order to form several distinct photosensitive areas each corresponding to a single cell or a pixel. A geometrical bound of the pixels or cells of the image sensor device is thus made. The image sensor device is thus provided with a plurality of pixels or single cells (FIG. 5F).

A removal of the handle layer 120 can then be performed (FIG. 5G). In order to make this removal easier, a prior cutting of this layer 120 can be provided.

In the case where the total thickness of the image sensor is low, a transparent material can possibly be deposited before the handle layer 120 is removed.

Then, a test of the image sensor device can be performed (FIG. 5H).

According to an alternative embodiment of the method, instead of making the photodetector stack 202-203-204 with a P-I-N type hetero-structure which is previously epitaxially grown, an undoped semi-conductor material based layer can be formed for example by bonding, and this material can then be doped, for example by ion implantation, and then the dopants can be annealed at temperature compatible with a CMOS method, for making a P-N junction.

In FIG. 6, a realization of the contacts 220a, 220b on each pixel is illustrated, a first contact 220a being provided on the area 204, a second contact 220b being provided on the area 202 of the photosensitive stack. These contacts can be made from a transparent material such as ITO ("Indium Tin Oxide").

According to another alternative (not shown), contacts common to a set of pixels can also be made.

In FIG. 7, another exemplary microelectronic device for detecting light radiation according to the invention is given.

In this example, transistors T' of a reading circuit are provided between the photodetector transistors T of the same type as that previously described in connection with FIGS. 1 to 3 and interconnection metal levels $M_1, \ldots, M_K$.

FIG. 8 illustrates experimental results obtained on N-type and P-type transistors having the arrangement of the same type of that of FIG. 2, which has been illuminated through the front face using a polychromatic white light and the evolution in the threshold voltage has been observed.

The transistors made in this example include a gate having a width W of 1.2 μm, a length L of 20 nm, a thickness of the semi-conducting layer 102 of 6 nm, a thickness of the insulating layer 101 of 25 nm. The semi-conducting layer 205 is of silicon and includes a N-P junction, arranged such that the N area is that located closer to the insulating layer 101. The P area of the layer 205 has been obtained by implanting through the insulating layer 101 and before making the transistor, boron ions at a dose of $3*10^{13}$ $cm^{-2}$ and an energy of 30 keV.

The N area of the layer 205 has in turn been obtained by implanting through the insulating layer 101 and before making the transistor, As ions at a dose of $4*10^{13}$ $cm^{-2}$ and an energy between 70 keV and 95 keV.

In FIG. 8, the curves $C_{10}, C_{20}, C_{30}$ represent an evolution in the threshold voltage $V_T$ of the N-type transistor having a N area of the semi-conducting layer 205 implanted with arsenic at a dose of $4*10^{13}$ $cm^{-2}$ and for respectively, an energy of 70 keV, 80 keV and 95 keV, as a function of a potential V taken on the back face of the semi-conducting layer 205.

The curves $C_{40}, C_{50}, C_{60}$ represent an evolution in the threshold voltage $V_T$ of the P-type transistor for an N area of the semi-conducting layer 205 implanted with arsenic at a dose of $4*10^{13}$ $cm^{-2}$ and respectively for an energy of 70 keV, 80 keV and 95 keV, as a function of a potential V taken on the back face of the layer 205.

The curves $C_{10}, C_{20}, C_{30}$ of FIG. 8 show that the threshold voltage of the N-type transistor, thus its characteristic Id(Vg) (with Id the current passing through the channel and Vg the gate potential) increases as the lighting increases.

The curves $C_{40}, C_{50}, C_{60}$ show that the threshold voltage $V_T$ of the P-type transistor decreases as the lighting increases.

The offset in threshold voltage $V_T$ obtained can be in the order of 20 mV-40 mV in absolute value and depends on the bias of the back face of the layer 205.

By adapting the thickness of the semi-conducting layer 102/thickness of the insulating layer 101 couple, a higher offset in threshold voltage can be obtained.

To obtain a coupling sensitivity higher than 50 mV/V, the $SiO_2$ based insulating layer 101 can be provided for example with a thickness of 5 nm, and a semi-conducting layer 102 be provided with a thickness between 3 nm and 50 nm, advantageously between 3 nm and 25 nm.

For a thickness of the insulating layer 101 equal to 10 nm, the thickness of the semi-conducting layer 102 can be provided between 3 nm and 100 nm, advantageously between 3 nm and 50 nm.

The operating principle and thickness ranges abovementioned remain valid for a channel area based on a semi-conductor material other than silicon, for example for a channel are based on germanium silicide.

The operating principle and thickness ranges abovementioned remain valid even when the material of the insulating layer 101 is not based on silicon oxide, but on an insulating material, such as for example silicon nitride or hafnium oxide.

The invention claimed is

1. An image sensor device, comprising:
   at least one transistor lying on a semiconductor-on-insulator substrate, the semiconductor-on-insulator substrate comprising:
      a semi-conducting layer, in which a channel area of the at least one transistor is disposed in a portion thereof, and
      an insulating layer separating the semi-conducting layer from a semi-conducting support layer,
   wherein the semi-conducting layer and the insulating layer extend beyond the channel area of the at least one transistor, and extend under at least a portion of a source region and at least a portion of a drain region of the at least one transistor,
   wherein the semi-conducting support layer comprises at least one photosensitive area including at least one P-doped region and at least one N-doped region forming a junction, the at least one photosensitive area being disposed facing the at least one transistor on a side of the channel area thereof and opposite a side of a gate electrode thereof, and
   wherein the insulating layer is configured to provide a capacitive coupling between the at least one photosensitive area and the semi-conducting layer.

2. The device according to claim 1, wherein the junction is a P-I-N type junction.

3. The device according to claim 1, wherein the insulating layer has a thickness less than or equal to 25 nm.

4. The device according to claim 3, wherein the semi-conducting layer has a thickness of less than 800 nm.

5. The device according to claim 3, wherein the semi-conducting layer has a thickness between about 5 nm and about 100 nm.

6. The device according to claim 1, wherein the photosensitive area comprises a material having a thickness greater than a reciprocal of the linear absorption coefficient of the material when the material is selected as a function of a wavelength or wavelength range of light radiation to be detected and in order to maximize a number of photons absorbed in the photosensitive part.

7. The device according to claim 1, wherein the photosensitive area and the semi-conducting layer are based on different semi-conductor materials.

8. An image sensor device, comprising:
   at least one transistor lying on a semiconductor-on-insulator substrate, the semiconductor-on-insulator substrate comprising:
      a semi-conducting layer, in which a channel area of the at least one transistor is disposed in a portion thereof, and
      an insulating layer separating the semi-conducting layer from a semi-conducting support layer,
   wherein the semi-conducting layer and the insulating layer extend beyond the channel area of the at least one transistor, and extend under at least a portion of a source region and at least a portion of a drain region of the at least one transistor,
   wherein the semi-conducting support layer comprises at least one photosensitive area including at least one P-doped region and at least one N-doped region forming a junction, the at least one P-doped region and the at least one N-doped region forming the junction extending across an entire length of the photosensitive area,
   wherein the at least one photosensitive area is disposed facing the at least one transistor on a side of the channel area thereof and opposite a side of a gate electrode thereof, and
   wherein the insulating layer is configured to provide a capacitive coupling between the at least one photosensitive area and the semi-conducting layer.

* * * * *